United States Patent [19]
Ferrante

[11] Patent Number: 5,953,812
[45] Date of Patent: Sep. 21, 1999

[54] MISINSERT SENSING IN PICK AND PLACE TOOLING

[75] Inventor: Todd Ferrante, Westerville, Ohio

[73] Assignee: Schlumberger Technologies, Inc., San Jose, Calif.

[21] Appl. No.: 08/887,993

[22] Filed: Jul. 3, 1997

[51] Int. Cl.[6] .............................. H05K 3/30; H05K 13/04; B23P 19/00
[52] U.S. Cl. .................................. 29/714; 29/740; 29/743; 29/832; 29/721; 29/407.1; 29/407.04; 29/833; 294/2; 294/64.1; 901/40; 414/737; 414/752
[58] Field of Search ........................ 29/740, 720, 407.04, 29/833, 743, DIG. 44, 760, 407.1, 407.09, 407.05, 721, 832; 414/737, 752; 294/2, 64.1; 901/40

[56] References Cited

U.S. PATENT DOCUMENTS

| | | | |
|---|---|---|---|
| Re. 33,974 | 6/1992 | Asai et al. ............................. | 29/407 |
| 4,222,737 | 9/1980 | Jones . | |
| 4,586,251 | 5/1986 | Kinoshita et al. . | |
| 4,683,654 | 8/1987 | Scholten et al. ...................... | 29/831 |
| 4,706,379 | 11/1987 | Seno et al. ............................. | 29/740 |
| 4,759,112 | 7/1988 | McLean et al . | |
| 4,772,125 | 9/1988 | Yoshimura et al. . | |
| 4,774,759 | 10/1988 | Makoto et al. . | |
| 4,791,715 | 12/1988 | Lovelace ................................ | 29/464 |
| 4,810,154 | 3/1989 | Klemmer et al. . | |
| 4,867,569 | 9/1989 | Mohara . | |
| 4,873,678 | 10/1989 | Nakamura et al. . | |
| 4,888,639 | 12/1989 | Yabe et al. . | |
| 4,951,385 | 8/1990 | Amao et al. . | |
| 5,003,692 | 4/1991 | Izumi et al. ........................... | 29/834 |
| 5,005,823 | 4/1991 | Fyler et al. ............................ | 271/228 |
| 5,018,936 | 5/1991 | Izumi et al. ........................... | 29/721 |
| 5,037,309 | 8/1991 | Abe et al. . | |
| 5,040,291 | 8/1991 | Janisiewicz et al. . | |
| 5,084,962 | 2/1992 | Takahashi et al. ................... | 29/833 |
| 5,086,559 | 2/1992 | Akatsuchi ............................. | 29/834 |
| 5,099,522 | 3/1992 | Morimoto . | |
| 5,153,983 | 10/1992 | Oyama . | |
| 5,180,974 | 1/1993 | Mitchell et al. . | |
| 5,195,821 | 3/1993 | Eguchi .................................. | 29/834 |
| 5,196,979 | 3/1993 | Saito . | |
| 5,207,465 | 5/1993 | Rich ...................................... | 29/743 |
| 5,212,881 | 5/1993 | Nishitsuka et al. .................. | 29/740 |
| 5,231,753 | 8/1993 | Tanaka et al. ........................ | 29/741 |
| 5,278,634 | 1/1994 | Skunes et al. ........................ | 356/400 |
| 5,290,081 | 3/1994 | Ogura ................................... | 29/743 |
| 5,291,364 | 3/1994 | Saito . | |
| 5,309,223 | 5/1994 | Konicek et al. ...................... | 356/375 |
| 5,313,448 | 5/1994 | Sukeda et al. . | |
| 5,373,949 | 12/1994 | Hayashi et al. . | |
| 5,379,514 | 1/1995 | Okuda et al. ......................... | 29/833 |
| 5,383,270 | 1/1995 | Iwatsuka et al. ..................... | 29/840 |
| 5,384,956 | 1/1995 | Sakurai et al. ....................... | 29/834 |
| 5,402,564 | 4/1995 | Tsukasaki et al. . | |
| 5,539,977 | 7/1996 | Kano et al. ........................... | 29/833 |
| 5,541,834 | 7/1996 | Tomigashi et al. ................... | 29/739 |

(List continued on next page.)

FOREIGN PATENT DOCUMENTS

| | | | |
|---|---|---|---|
| 192994-A | 9/1986 | European Pat. Off. ............... | 414/737 |
| 597447- A1 | 5/1994 | European Pat. Off. ............... | 29/720 |
| 2639335 | 5/1990 | France .................................. | 901/40 |
| 3-104300 | 5/1991 | Japan .................................... | 29/720 |
| 3-291998 | 12/1991 | Japan .................................... | 29/743 |
| 4-51600 | 2/1992 | Japan .................................... | 29/743 |
| 4-64289 | 2/1992 | Japan .................................... | 29/740 |
| 4-179198 | 6/1992 | Japan .................................... | 29/720 |
| 4-369900 | 12/1992 | Japan .................................... | 29/743 |
| 6-91577 | 4/1994 | Japan .................................... | 294/64.1 |

*Primary Examiner*—David P. Bryant
*Assistant Examiner*—John Preta
*Attorney, Agent, or Firm*—Danita J. M. Maseles

[57] ABSTRACT

The head of a pick and place system for removing IC parts from a tray and inserting them into a burn-in board (BIB) includes one or more sensors which detect light reflected from a part picked up from a tray and outputs a signal which can be analyzed to determine if the part is improperly seated in the head (misprecised) or improperly inserted into the socket of a BIB (misinserted).

13 Claims, 4 Drawing Sheets

U.S. PATENT DOCUMENTS

| | | | |
|---|---|---|---|
| 5,544,411 | 8/1996 | Kano et al. | 29/740 |
| 5,560,531 | 10/1996 | Ruszowski | 228/19 |
| 5,566,447 | 10/1996 | Sakurai | 29/740 |
| 5,570,993 | 11/1996 | Onodera et al. | 29/740 |
| 5,619,521 | 4/1997 | Tanaka . | |
| 5,625,941 | 5/1997 | Ozawa . | |
| 5,650,732 | 7/1997 | Sakai . | |
| 5,652,523 | 7/1997 | Noguchi . | |
| 5,661,239 | 8/1997 | Takeuchi | 29/743 |
| 5,680,746 | 10/1997 | Hornisch . | |
| 5,724,722 | 3/1998 | Hashimoto | 29/740 |
| 5,749,142 | 5/1998 | Hanamura | 29/833 |
| 5,768,759 | 6/1998 | Hudson | 29/407.04 |
| 5,768,765 | 6/1998 | Fujioka et al. | 29/740 |

MISINSERT SENSING IN PICK AND PLACE TOOLING

FIELD OF THE INVENTION

The present invention relates to improvements in pick and place tooling such as is used in the semiconductor industry to move IC parts from a tray to a burn-in board. In particular, the invention relates to the sensing of IC parts which are misinserted in a burn-in board socket or in a precisor of a pick and place device.

BACKGROUND OF THE INVENTION

In the process of semiconductor IC manufacturing, one of the final steps is burn-in. In a burn-in process, IC devices are loaded into sockets on boards which are provided with electrical contacts which provide input to the devices and test the response of the device while the board is held at elevated temperature in an oven for a prolonged period of time. In order to optimize this process, many devices are loaded into each burn-in board (BIB), and many BIBs are loaded into each oven. Prior to burn-in, the devices are located in trays for transportation through the manufacturing process. For burn-in to proceed, it is necessary for the devices to be removed from the tray and loaded into the BIB (and vice versa at the end of burn-in), the apparatus used to accomplish this being known as a burn-in board loader/unloader, one example of which is the BLU 300 available from Schlumberger Technologies, Inc., ATE Division, San Jose, Calif. The BLU 300 is described in detail in U.S. application Ser. No. 08/664,099, the contents of which are incorporated herein by reference.

In use, the BLU 300 picks a device from a location in a tray using a handler head with vacuum nozzle. The handler head is then moved to a location in the BIB and the device placed in a socket, the intent being that the action of the handler head should provide the device in a correct alignment for the device to be inserted accurately in the BIB socket. The socket itself can be provided with lead-in bevels to assist with insertion of the device. When moving devices from trays to sockets, the socket lead-ins determine how precisely the device must be positioned when it is dropped into the open socket. If the trays hold the device precisely enough, in a known location, and the socket lead-ins are generous, the device may be picked up with a simple suction cup and dropped directly into the socket. If the device is loose in the tray, the device must be precised to a more tightly controlled location before dropping it into the socket. One method for precising is to drop the device into a precising station, which centers the device, and then pick it up from the more precise location and drop it into the socket. A quicker method is to suck the device up into a pocket (precisor) on the nozzle head. The pocket centers the device, which is then dropped into the socket from the precised location. For the nozzle precisor to work properly, the device must be fully seated in the pocket. If the device is very far out of position, or if the suction cup is too stiff, or if the device is oversized, it may not seat. In this case, it is desirable to either drop the device and attempt to reacquire it from a more favorable position, or to reject the device as not suitable for placement with the tooling. A sensor is required to sense whether the device is properly seated.

When the device is dropped into the socket, it may not fully seat correctly in the socket. Among the causes for misplaced devices are a bent or damaged device or socket, an out of position nozzle, and a socket which is not fully opened. It is important that misplaced device be sensed and handled correctly. Burn in boards should be fully loaded with properly seated device to maximize testing yield. Misprecised devices need to be either replaced or rejected. It is also possible for some good devices to misinsert and be damaged if a socket is allowed to close upon the misinserted device. Misinserts must be detected in order to avoid damaging device. Previously, misinserts have been detected by allowing a lightweight flag to ride upon the back surface of the device as it falls into the socket. A sensor uses a light beam to detect whether the flag is at the proper height when the device is seated (indicates proper seating) or if the flag is too high (indicates a misinserted device). Unfortunately, these flags are prone to sticking in position and becoming useless. Also, some device must free fall into the socket in order to seat properly. Misinsert flags may interfere with the seating of the device.

It is an object of the invention to provide a system which can detect misinserted or misprecised devices without the drawbacks of the prior art systems.

SUMMARY OF THE INVENTION

The present invention resides in the provision of a sensor in a seat in the head of a pick and place system which detects light reflected from a part and outputs a signal which can be analyzed to determine if the part is improperly seated in the head (misprecised) or improperly inserted into the socket of a BIB (misinserted).

The advantage of the present invention is that there are no moving parts used to detect a misinsert or misprecise to malfunction or which take time to settle. Thus the system can have increase reliability and throughput time.

The head typically includes one or more seats in which IC parts are located when they are picked from a tray or BIB. Each seat can have one or more sensors located in the base. By using more than one sensor spaced in the seat, it is possible to detect tilted parts in the seat as well as parts which have not entered the seat properly or are misinserted into the BIB socket.

The signals from the sensor are fed to the control system of the pick and place which is calibrated to identify those signal levels which are indicative of misinsert or misprecise. On detection of either of these events, the system can take appropriate remedial action such as replacement of the part in the tray and reacquisition, replacement and selection of another part, removal from the BIB and reinsertion, or removal from the BIB socket and discard followed by selection of a new part from the tray to be inserted into that socket. The use of a dual channel amplifier for each sensor so that a single sensor can make measurements at the two levels encountered for misprecise or misinsert detection.

DESCRIPTION OF THE PREFERRED EMBODIMENT

Figure 1:
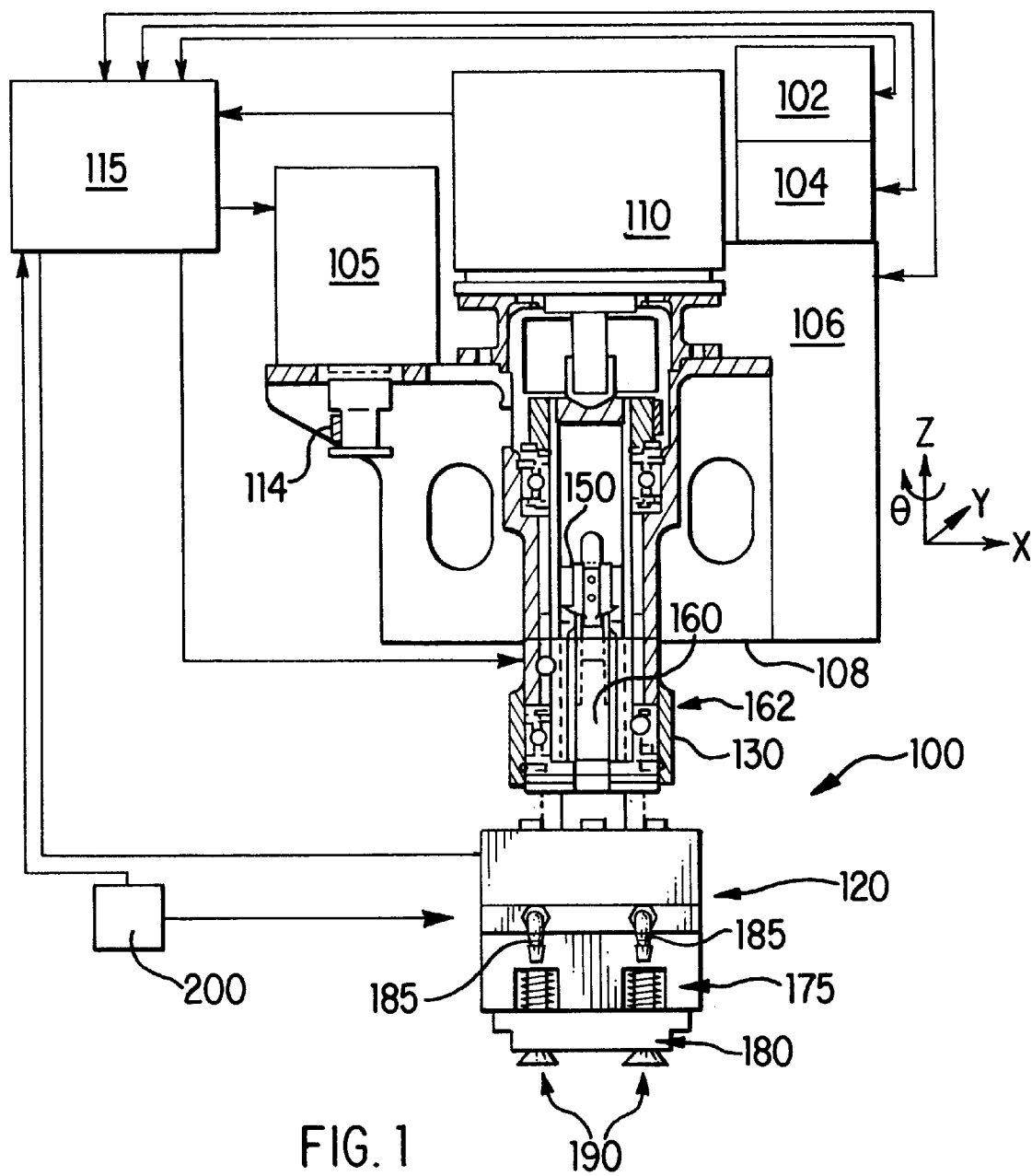
FIG. 1 shows a side view of a pick and place system which embodies the present invention.

FIG. 1 shows in partially cut-away elevation view an example of a handing apparatus which is described in more detail in U.S. application Ser. No. 08/664,099. The BIB loader/unloader such as the Schlumberger model BLU300 (and as shown schematically in FIG. 4 with parts omitted for clarity) includes an X-servo 102 and a Y-servo 104 are directed by a programmable controller 115 to position a head 120 in the X- and Y-directions relative to sockets of a BIB or tray (not shown), and a Z-servo 106 is directed by the programmable controller 115 to move head 120 vertically (in the Z-direction). Such a system can be used to select a part from a tray, insert a part in or remove a part from a socket in a BIB, and return the part to the tray. In the embodiment shown, servos 102, 104 and 106 position a bracket 108 to which the head 120 is attached by a theta-axis assembly which comprises a housing 130 supported by bracket 108 and in which a spindle assembly 162 is mounted for rotation in the theta direction (about the Z-axis). The spindle assembly 162 is rotated by a theta-axis servo 105 under control of programmable controller 115. A drive belt 114 (visible in section) connects the shaft of servo 105 to a spindle 160 of spindle assembly 162. A theta-axis encoder 110 reports the rotational position of spindle 160 to controller 115. Programmable controller 115 is shown as a single box, but typically includes a variety of elements including as a programmable general-purpose processor with memory and input/output devices, pneumatic source and control elements, solenoids, switches, sensors and other well-known elements required to control the system in the manner described.

The head 120 includes a nozzle body 175, and a precisor block 180, the structure and operation of which are described below. A pair of nozzles 190 passing through nozzle body 175 are connected by lines to a source of "puff" air pressure or to a vacuum source via fittings 185 as directed by controller 115. A sensor 200 communicating with controller 115 detects vacuum/pressure in the line.

Figure 2:
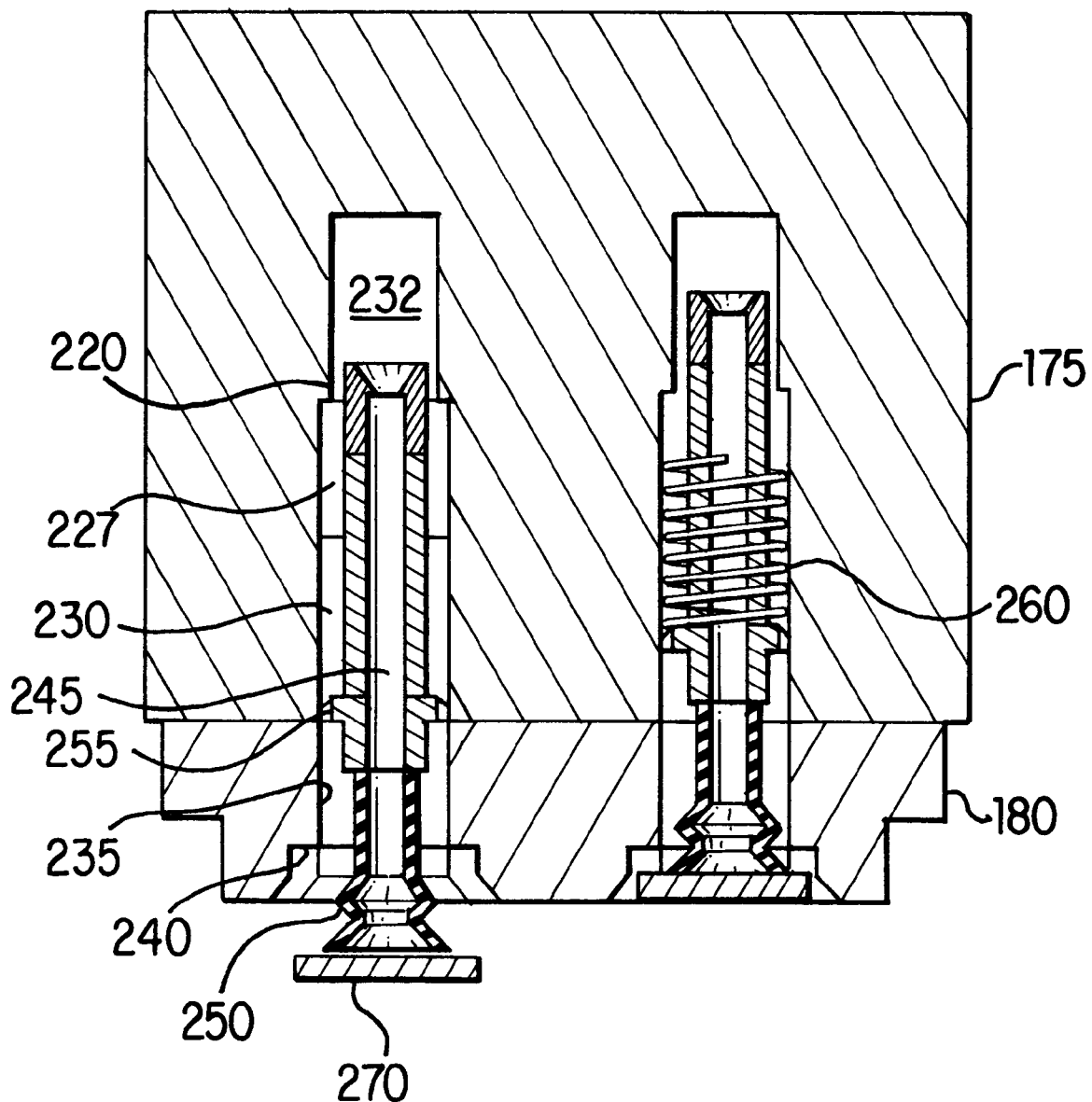
FIG. 2 shows a section through the head of the system shown in FIG. 1.
Figure 3:
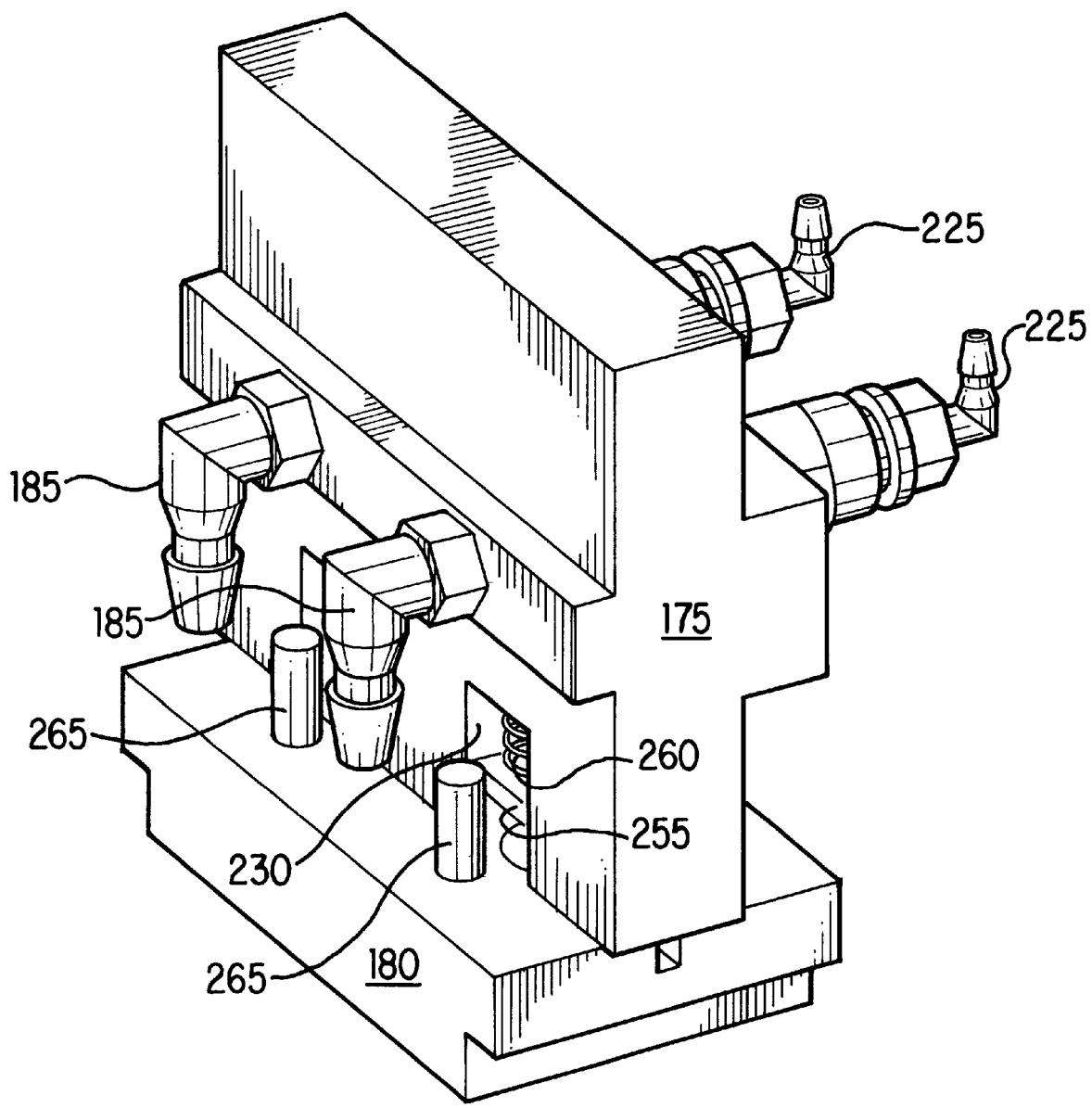
FIG. 3 shows an perspective view of the head from above.
Figure 4:
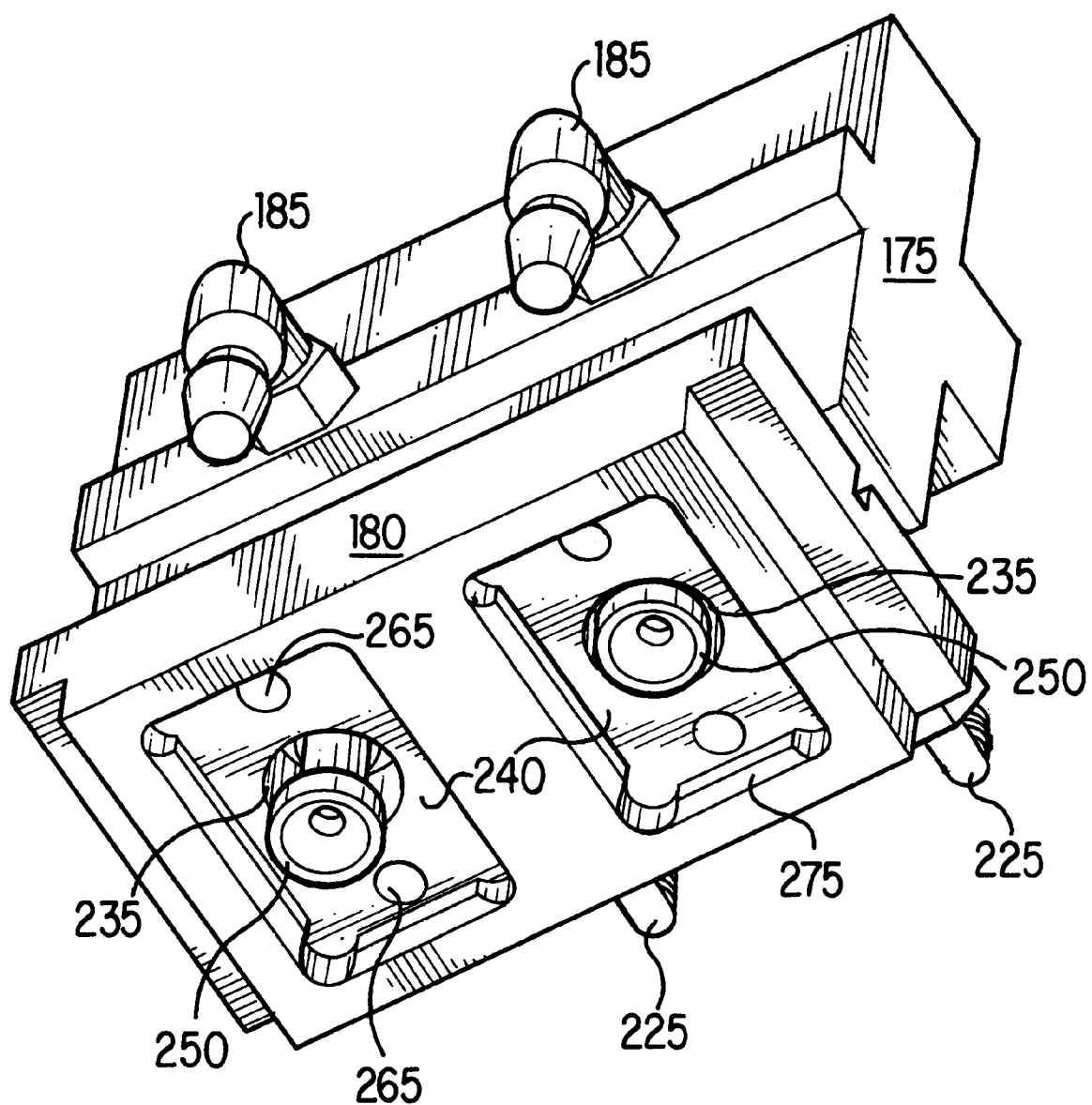
FIG. 4 shows an perspective view of the head from below.

FIGS. 2, 3 and 4 show more detailed views of the head 120. In the embodiment shown here, the head 120 includes two precisor seats, each with a vacuum nozzle and sensor arrangement. The head 120 comprises a nozzle body 175 having bores 220 provided therein. An annular bushing 227 is provided part way along each bore and the lower part of the bore 220 below the bushing 227 is open so as to define a spring seat 230. The fit between the nozzle 190 and the bushing 227 forms a seal such that the part of the bore above the bushing 227 defines a vacuum chamber 232 which is connected to the vacuum/pressure source (not shown) via fittings 185. A pressure sensor is provided in the supply lines for the vacuum/pressure source and a pneumatic lock (not shown) is included in each chamber 232 which serves to lock the nozzle 190 in a retracted position when required. A pneumatic supply line (not shown) is connected to the lock via connection 225. The precisor block 180 is attached to the lower end of the nozzle body 175 and has complementary bores 235 connecting to precisor seats 240 and to the bores 220/spring seat 230 in the nozzle body 175. An elongate nozzle 245 is received in each bore 220 so as to be slidable in the bushing 227. The nozzle 245 includes a rubber suction cup 250 which projects through the complementary bore 235 and precisor seat 240. A collar portion 255 is formed around the lower end of the nozzle 245 and a compression spring 260 is located around the nozzle 245 between the collar 255 and the lower end of the bushing 227. The collar is larger than the complementary bore 235 which prevents the spring 260 from ejecting the nozzle 245 from the body 175. A pair of sensors 265 is provided in the precisor block 180 for each precisor seat 240, the sensors 265 passing through the block 180 into the base of the seat 240 either side of the complementary bore 235 and nozzle 245. Suitable sensors are Keyence FU-48 retroreflective light sensors, the output signal of which are fed to Keyence FS-V1 dual-channel digital amplifiers forming part of the controller 115.

In use, the head 120 is moved so as to be positioned above a part 270 in a tray (not shown) with the upper surface of the part closing the open end of the rubber cup 250 of the nozzle 245. Application of a vacuum to the chamber 232 causes the nozzle 245 to retract into the bore 220 against the action of the spring 260 and part 270 to be lifted out of the tray and into the precisor seat 240 (as shown on the right hand side of FIG. 2). The angled edges 275 of the seat 240 force the part 270 to locate in the seat 240 in cases where there is a minor misalignment between the part and the seat. At this point, the output from the sensors 265 is compared to a predetermined level for a part properly located in the seat 240. If the signal from both sensors is too high, this indicates that the part has not seated properly. This can be caused by the misalignment of the part and seat being too great for the bevel on the edges 275 of the seat 240 to realign the part. If one sensor gives a reading higher than the other, the part is tilted in the seat. In either case, the system can be programmed to return the part to the tray by releasing the vacuum and, optionally providing a "puff" of air to release the part (as shown in the left hand side of FIG. 2). The system can then attempt to reaquire the same part in the hope that the tray has aligned the part more accurately. Alternatively, the system can be instructed to acquire a part from another location in the tray. Once proper seating of the part in the precisor seat is confirmed by the sensors, the head is moved over the BIB and the part placed in a socket in the same manner as it would be returned to the tray. At this point, the output from the sensors 265 is compared to another predetermined level to detect whether or not the part is properly inserted into the socket. If the sensors indicate improper insertion, the system can be instructed to require the part from the socket and attempt to reinsert it into the socket properly. Alternatively, the part can be returned to the tray and another part inserted in that socket.

Changes could be made to the system described above while still staying within the scope of the present invention. For example:

1) More or fewer sensors might be used to perform the detection. A larger part might require more sensors, and a smaller part might only have space for one.
2) The sensors might be used with single channel amplifiers to only sense for misinsert or to only sense for misprecise instead of using a dual channel amplifier to check for both.
3) The downward looking, non-contact, sensor might also be used on a nozzle with no pocket that simply pulls the part to a backstop. The sensor could check for backstop seating, misinsert, or both.
4) The nozzle pick height from the tray might be set so the misinsert detection intensity indicated whether there was a part present in the tray pocket. This could save time over other part detect methods.

I claim:
1. A pick and place system for removing individual parts from a tray carrying a plurality of parts, comprising:
   a) an acquisition head which is moveable over the tray so as to be positioned over an individual part;
   b) a seat defined within the head for holding a part in predetermined alignment, with respect to "X" and "Y" axis, in the head, wherein the "X" and "Y" axes are defined as axes forming a x-y plane substantially parallel to a plane of a part which is correctly positioned within the seat;

c) a retractable means located in the seat for lifting the individual part from the tray into the head;

d) a sensor contained within the seat which detects light reflected from the part to detect whether the individual part is correctly positioned within the seat with respect to the "Z" axis and that the distance from the sensor to the side of the part nearest the sensor is correct and outputs a signal in response to the reflected light, wherein the "Z" axis is defined as an axis substantially perpendicular to the x-y plane; and e) a control system which receives and analyses the signal output by the sensor and provides control signals to the head in accordance to the analyzed signal.

2. A system as claimed in claim 1, wherein the head is further moveable so as to be positioned over a socket in a burn-in board.

3. A system as claimed in claim 1, wherein the seat is shaped so as to force a part into the predetermined alignment as it is inserted into the seat.

4. A system as claimed in claim 1, wherein the means for lifting the part into the head comprises a suction nozzle located in the seat.

5. A system as claimed in claim 1, wherein a plurality of sensors are provided in the seat, each of which provides an output signal to the control system which analyzes each of the signals and outputs control signals accordingly.

6. A system as claimed in claim 1, wherein the control system analyzes the signal output by the sensor by comparison with predetermined signal levels indicative of the position and alignment of a part in the seat.

7. A system as claimed in claim 6, wherein the sensor output signals are analyzed to detect a part which is improperly seated in the seat and, on detection of an improperly seated part, to provide control signals to the head to correct such a fault.

8. A system as claimed in claim 2, wherein the means for lifting a part from the tray is operable to deposit the part into the socket.

9. A system as claimed in claim 8, wherein the sensor also detects light reflected from the part in the socket and provides a further output signal to the control system.

10. A system as claimed in claim 9, wherein the control system analyzes the further output signal to determine that the part is correctly inserted into the socket.

11. A system as claimed in claim 10, wherein the further output signals are analyzed to detect a part which is improperly inserted in the socket and, on detection of an improperly inserted part, to provide control signals to the head to correct such a fault.

12. A system as claimed in claim 11, wherein the signals from the sensor are processed by a dual channel amplifier to detect improperly seated and improperly inserted parts.

13. A system as in claim 5 wherein the control system compares output signals from the plurality of sensors to determine whether the part is tilted in the head.

* * * * *